(12) United States Patent
Kooijman et al.

(10) Patent No.: US 8,941,072 B2
(45) Date of Patent: Jan. 27, 2015

(54) SILICON DRIFT DIODE DETECTOR CONFIGURED TO SWITCH BETWEEN PULSE HEIGHT MEASUREMENT MODE AND CURRENT MEASUREMENT MODE

(75) Inventors: Cornelis Sander Kooijman, Veldhoven (NL); Gerard Anne Nicolaas van Veen, Waalre (NL)

(73) Assignee: FEI Company, Hillsboro, OR (US)

( * ) Notice: Subject to any disclaimer, the term of this patent is extended or adjusted under 35 U.S.C. 154(b) by 17 days.

(21) Appl. No.: 13/544,776

(22) Filed: Jul. 9, 2012

(65) Prior Publication Data

US 2013/0099114 A1  Apr. 25, 2013

Related U.S. Application Data

(60) Provisional application No. 61/505,404, filed on Jul. 7, 2011.

(30) Foreign Application Priority Data

Jul. 7, 2011  (EP) .................................... 11172955

(51) Int. Cl.
*G01T 1/04* (2006.01)
*H01J 37/244* (2006.01)
*H01L 31/115* (2006.01)
*G01T 1/24* (2006.01)
(Continued)

(52) U.S. Cl.
CPC ............... *G01T 1/24* (2013.01); *G01T 1/2928* (2013.01); *H01J 37/244* (2013.01); *H01L 31/115* (2013.01); *H01J 37/261* (2013.01); *H01J 37/28* (2013.01); *H01J 2237/24415* (2013.01); *H01J 2237/2448* (2013.01)

USPC .................. 250/370.06; 250/370.09; 257/192

(58) Field of Classification Search
CPC ...................... H01J 37/244; H01J 2237/24415; H01J 2237/2441; H01J 2237/2448; H01J 2237/24495; G01T 1/16; G01T 1/24; G01T 1/247; G01T 1/2928; G01T 1/17; H01L 31/115; H01L 27/14676
USPC .......................... 257/225, 232, 192, 504, 401; 250/370.01, 370.09, 370.06, 370.14; 378/116
See application file for complete search history.

(56) References Cited

U.S. PATENT DOCUMENTS 3,813,545 A * 5/1974 Barnhart et al. ............... 250/306
4,149,076 A * 4/1979 Albert .......................... 378/98.6
(Continued)

OTHER PUBLICATIONS

Alberti, R., et al., 'Performance of Different Readout Topologies of Silicon Drift Detectors in PIXZE Spectroscopy,' IEEE Nuclear Science Symposium Conference Record, Oct. 19, 2008, pp. 2575-2580.
(Continued)

*Primary Examiner* — Brooke Purinton
(74) *Attorney, Agent, or Firm* — Scheinberg & Associates, PC; Michael O. Scheinberg

(57) ABSTRACT

A detector with a Silicon Diode and an amplifier, and a feedback element in the form of, for example, a resistor or a diode, switchably connected to the output of the amplifier. When the feedback element is selected via a switch, the detector operates in a Current Measurement Mode for determining electron current, and when the element is not selected the detector operates in its well-known Pulse Height Measurement Mode for determining the energy of X-ray quanta.

14 Claims, 2 Drawing Sheets

Figure 1A:
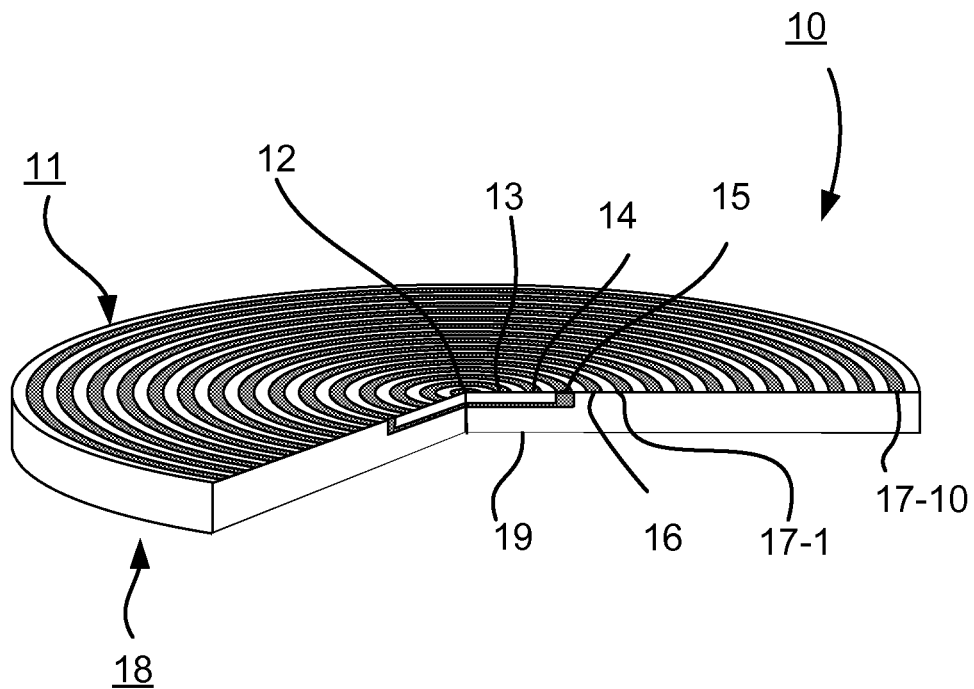

(51) Int. Cl.
*G01T 1/29* (2006.01)
*H01J 37/26* (2006.01)
*H01J 37/28* (2006.01)

(56) References Cited

U.S. PATENT DOCUMENTS

| | | | |
|---|---|---|---|
| 4,186,307 A * | 1/1980 | Tanaka et al. | 250/363.02 |
| 4,775,834 A * | 10/1988 | Lahti | 324/142 |
| 5,113,077 A * | 5/1992 | Shimizu et al. | 250/370.11 |
| 7,187,316 B1 * | 3/2007 | DeGeronimo | 341/155 |
| 7,411,198 B1 * | 8/2008 | Holland et al. | 250/370.01 |
| 7,586,108 B2 | 9/2009 | Nihtianov et al. | |
| 7,858,946 B2 | 12/2010 | Rohde | |
| 8,049,182 B2 * | 11/2011 | Bewick | 250/396 ML |
| 8,198,577 B2 * | 6/2012 | Dierickx | 250/214 R |
| 2005/0105665 A1 * | 5/2005 | Grodzins et al. | 376/157 |
| 2008/0001095 A1 * | 1/2008 | Astley et al. | 250/370.09 |
| 2008/0317200 A1 * | 12/2008 | Lecomte et al. | 378/19 |
| 2009/0021717 A1 | 1/2009 | Nihtianov et al. | |
| 2009/0073735 A1 * | 3/2009 | Kesler | 363/163 |
| 2010/0163742 A1 | 7/2010 | Watanabe et al. | |
| 2011/0031215 A1 * | 2/2011 | Mantz et al. | 216/60 |
| 2011/0169116 A1 | 7/2011 | Nanver et al. | |
| 2012/0273679 A1 * | 11/2012 | Bewick et al. | 250/310 |

OTHER PUBLICATIONS

Fiorini, C., 'A CMOS charge preamplifier for silicon drift detectors with on-chip JFET and feedback capacitor,' Nuclear Instruments and Methods in Physics A, Aug. 10, 2006, pp. 322-328, vol. 568.
'Amptek Silicon Drift Detectors,' http://www.amptek.com/pdf/ansdd3.pdf, retrieved Apr. 26, 2013, 7 pgs.
Lechner, P., et al., 'Silicon drift detectors for high resolution, high count rate x-ray spectroscopy at room temperature,' International Centre for Diffraction Data 2004, Advances in X-Ray Analysis, 2004, pp. 53-58, vol. 47.
Niculae, A., et al., 'Optimized readout methods of silicon drift detectors for high-resolution X-ray spectroscopy,' Nuclear Instruments and Methods in Physics Research A, 2006, pp. 336-342, vol. 568.
'On-board electronics for X-ray detectors,' http://home.dei.polimi.it/sampietr/Ratex/RATEX1.html, retrieved Apr. 26, 2013, 5 pgs.
'PNSensor Silicon Drift Detector Development,' http://www.pnsensor.de/Welcome/Detector/SDD/index.html, retrieved Apr. 26, 2013, 4 pgs.
Fiorini, C., et al., 'Charge-Sensitive Preamplifier With Continuous Reset by Means of the Gate-to-Drain Current of the JFET Integrated on the Detector,' IEEE Transactions on Nuclear Science, Jun. 2002, pp. 1147-1149, vol. 49, No. 3.
Fiorini, C., et al., 'Charge-Sensitive Preamplifier With Continuous Reset by Means of the Gate-to-Drain Current of JFET Integrated on the Detector,' IEEE transactions on Nuclear Science, Nov. 4-10, 2001, pp. 1018-1020, vol. 2.
Fiorini, C., et al., 'Continuous Charge Restoration in Semiconductor Detectors by Means of the Gate-to-Drain Current of the Integrated Front-End JFET,' IEEE Transactions on Nuclear Science, 1999, pp. 761-764, vol. 46, No. 3.
Gatti, P., et al., 'Semiconductor Drift Chamber—An Application of a Novel Charge Transport Scheme,' Nuclear Instruments and Methods in Physics Research, 1984, pp. 608-614, vol. 225.
Struder, L., 'High Resolution Silicon Detectors for Photons and Particles,' Radiation Protection Dosimetry, 1995, pp. 39-46, vol. 61, No. 1-3.
Struder, L., 'High-resolution imaging X-ray spectrometers,' http://www.hll.mpg.de/07_publication/2000/nima_45473.pdf, retrieved Feb. 3, 2010, 41 pgs.

* cited by examiner

SILICON DRIFT DIODE DETECTOR CONFIGURED TO SWITCH BETWEEN PULSE HEIGHT MEASUREMENT MODE AND CURRENT MEASUREMENT MODE

This application claims priority from U.S. Provisional Patent Application 61/505,404, filed Jul. 7, 2011, which is hereby incorporated by reference.

The invention relates to a radiation detector for detecting X-rays, the detector comprising a Silicon Diode.

Such a detector is known from "Optimized readout methods of silicon drift detectors for high-resolution X-ray spectroscopy", A. Niculae et al., Nuclear Instruments & Methods in Physics Research A, 568 (2006) 336-342, further referred to as Niculae [-1-].

The known publication discloses as detector comprising a Silicon Drift Diode (SDD) and associated electronic circuitry.

A SDD shows an active volume where impinging radiation, such as X-ray photons, generate electron-hole pairs. As a result of the internal electric field in the diode the electrons drift to the anode where they charge the anode to a corresponding potential. The anode is very small, and thus has a very small capacitance with respect to the cathode. A capacitance of less than 0.5 pF, nowadays typically 0.15 pF, is achieved, and thus a small number of electrons already results in a signal that is sufficiently large to detect. The signal induced on the anode is buffered with a FET that is integrated with the SDD, as otherwise the capacitance of the wiring would already deteriorate the signal.

Detectors using an SDD are known to be used in, for example, a Scanning Electron Microscope (SEM). In a SEM a finely focused beam of electrons scans over the surface of a sample. The electrons typically have an energy between 200 eV and 30 keV, although lower and higher energies are known to be used. The electrons interact with the sample and as a result radiation emerges from the sample. The radiation typically comprises secondary electrons (SEs, emerging from the sample with an energy below 50 eV), backscattered electrons (BSEs, emerging from the sample with an energy above 50 eV), and characteristic X-ray photons (X-rays). The X-rays give information about the composition of the material of the sample.

A limitation of the SDD is the number of pulses per second that can be counted:
The speed of the SDD is limited by the time the electrons take to travel to the anode and the repelling effect (also known as the ballistic deficit effect) of the electrons during this time. This results in a finite rise time in the order of 50 to 100 nsec. Furthermore subsequent electronics limit the count rate. In practice a count rate of $5\times10^5$ counts per second to $1\times10^6$ counts per second can be achieved.
At regular times the charge on the integrating capacitor needs to be reset. This is often done by an external reset circuitry that is triggered when the output signal exceeds a certain threshold. Resetting the device usually takes a couple of microseconds in which time the SDD is not able to respond on input signals, thereby further limiting the count rate.

It is noted that the SDD can also work in a internal, self-biasing reset mode, where the anode charge is compensated by leakage from the drain of the FET to the anode. This mode, however, results in slightly worse performance (energy discrimination).

In principle a SDD could also be used for detecting electrons, provided the electrons are sufficiently energetic to reach the active volume of the SDD.

A problem when using said detectors in a SEM at a position where the SDD is hit by BSEs is that the number of BSEs generated is much larger than the number of X-ray photons. Detecting $10^6$ electrons per second is equivalent to a current of only 0.16 pA, while a SEM typically operates in a mode in which a BSE current is in excess of 1 pA, more specifically 100 pA, and where the BSE current may be orders of magnitude larger (1 nA or more).

It is noted that, to avoid that such detectors are 'blinded' by BSEs, such detectors are often equipped with a window that transmits X-rays and blocks electrons. As an example the detector of US patent application US2010/0163742 is mentioned. Also other, more sophisticated ways of avoiding BSEs to reach the detector are known, such as deflection of the BSEs.

A draw-back of detectors using an SDD is that they are not equipped to detect a BSE signal with a current in excess of 1 pA, more specifically in excess of 1 nA. On the other hand, as the detector is typically placed in a position where also BSEs could be detected (just above the sample), there is a need for a detector with an SDD (for its performance as X-ray detector) that is capable to detect BSEs.

The invention intends to provide a solution to said problem.

To that end a detector according to the invention is characterized in that the Silicon Drift Diode comprises a voltage/current converter (208) between an I/O port and the anode, the detector equipped to selectively connect the voltage/current converter in an analog feed-back loop via a switch (209), as a result of which the Silicon Drift Diode is equipped to switchably operate in a pulse height measurement mode (PHMM) or a current measurement mode (CMM).

By feeding a feedback current to the anode, the SDD is used in CMM, in which the output signal of the detector depends on the number of electron/hole pairs generated per second. No reset is needed, as the voltage on the anode is kept at a constant voltage due to the feed-back loop. This mode is preferred when detecting for example BSEs, when the maximum count rate is exceeded.

It is mentioned that the phrase "analog feed-back loop" is used to describe that the signal that is fed back can take any value along a substantially continuous scale, as opposed to a logical signal that can take only two values. The switch can be either a mechanical switch (for example a reed relay) or an electronic switch (for example comprising one or more FETs). It may also be that the output signal is a digital output signal, and that in the feed-back loop this digital signal is converted using a Digital to Analog Converter (DAC). In that case the switch may take the form of controlling the conversion of the DAC, in which one state of the control keeps the output of the DAC constant, irrespective of the (digital) input to the DAC.

It is noted that Niculae [-1-] describes a voltage/current converter that is placed between an I/O port and the anode, but via a comparator, so that the signal fed back is a logical signal.

It is further noted that in "A CMOS charge preamplifier for silicon drift detectors with on-chip JFET and feedback capacitor", C. Fiorini et al., Nuclear Instruments & Methods in Physics Research A, 568 (2006) 322-328, in its FIG. 1 a circuit is shown where an analog feed-back is provided via resistors $R_1$ and $R_g$. However, this circuit does not possess a switch between output and anode to switchably operate in a pulse height measurement mode (PHMM) or a current measurement mode (CMM).

If the voltage/current converter is resistive, then the output signal of the detector is proportional to the number of electron/hole pairs.

If the converter shows a logarithmic voltage/current characteristic (for example caused by a diode), then the output signal shows a logarithmic dependency to the number of electron/ hole pairs. It is noted that the reset diode which is typically present on the SDD can be used as voltage/current converter showing a logarithmic dependency.

By disconnecting the voltage/current feedback the SDD operates in its well-known PHMM, thus detecting the energy per event. This mode is preferred when detecting the energy of X-rays.

It is noted that, when operating the detector in PHMM, exposure of the detector to BSEs should be avoided. This can be done by deflecting the electrons with a magnetic or electrostatic field, by decelerating the electrons to such an energy that they either do not reach the detector or hit the detector with an energy so low that they do not penetrate in the detector, or by mechanically positioning a foil between the electron source and the detector, the foil transparent to X-rays (for example a thin plastic foil).

It is further mentioned that in PHMM reset circuitry should be used, or the self biasing reset, but that in CMM this is not necessary.

In a preferred embodiment of the invention the SDD shows a sensitive surface, the sensitive surface sensitive to radiation, the sensitive surface opposite to the surface on which the anode is formed, and the SDD shows an active volume close to the sensitive surface, the distance of the active volume to the sensitive surface sufficiently small for electrons with an energy of 20 keV, more specifically 2 keV, most specifically 500 eV, to penetrate to this active volume and generate electron/hole pairs in the active volume, as a result of which the detector can selectively be used as a detector for detecting X-rays or as a detector for detecting X-rays and electrons in a charged particle apparatus.

A SDD shows an active volume in which the electron/hole pairs are generated and collected to either the anode (electrons) or the cathode (holes). In a prior art SDD the distance of the active volume to the sensitive surface is sufficiently small for X-rays to penetrate the active volume and generate electron/hole pairs.

For electrons to generate electron/hole pairs the distance between the sensitive surface and the active volume is, for commercially available prior art SDD's, too large for electrons with an energy of, for example 1 keV, to penetrate the active volume. By forming the active layer just under the sensitive surface (which should be conductive, as it acts as cathode), also low energy electrons can penetrate into the active volume.

Techniques for forming such thin layers are known to the person skilled in the art. As an example European Application publication EP2009705 teaches how such a layer (for example a boron layer) can be formed. Also European Application EP11150672 teaches such layers. Thin layers using other materials are also known to the person skilled in the art.

In an aspect of the invention a charged particle apparatus is equipped with the detector according to the invention, the apparatus is equipped to scan a sample with a finely focused charged particle beam, as a result of which secondary radiation including X-rays, back-scattered electrons and secondary electrons emerge from the sample, the apparatus equipped with means for selectively blocking the backscattered electrons and secondary electrons emerging from the sample to reach the detector or for passing the backscattered electrons and/or secondary electrons, the means passing X-rays emerging from the sample.

An apparatus equipped to scan a sample with a finely focused charged particle beam, as a result of which secondary radiation including X-rays, back-scattered electrons and secondary electrons emerge from the sample is known to the skilled person as, for example, a Scanning Electron Microscope (SEM), a Scanning Transmission Electron Microscope (STEM), or a Focused Ion Beam instrument (FIB).

By using the detector according to the invention in an apparatus that can selectively pass or block the electrons from reaching the detector, the detector can be used as a standard X-ray detector, or as an electron detector. In the latter mode, detecting for example BSEs or SEs, the detector also detects X-rays, but the contribution of X-rays to the total signal is negligible, as X-rays are generated with a much lower efficiency than BSEs and SEs.

The means can take the form of a switchable magnetic or electrostatic field deflecting the electrons, a switchable electric field decelerating the electrons to such an energy that they reflected or reach the detector with an energy so low that they do not penetrate to the active volume, or a mechanical means moving (inserting) or removing a foil between the electron source (the sample) and the detector, the foil transparent to X-rays (for example a thin plastic foil).

Figure 1B:
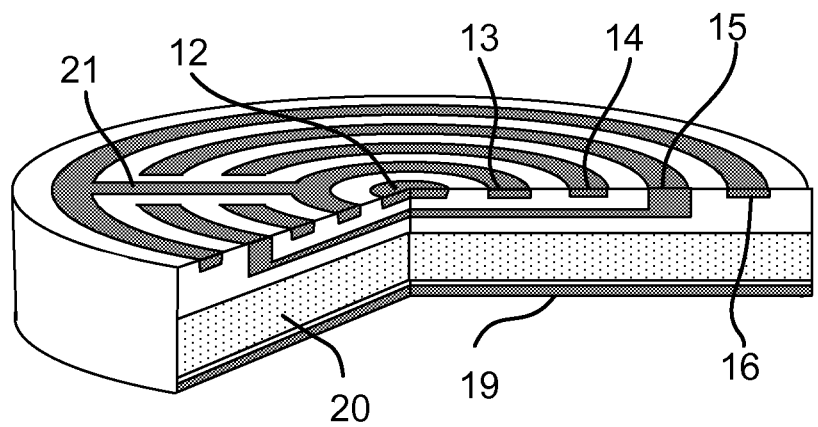
Figure 2A:
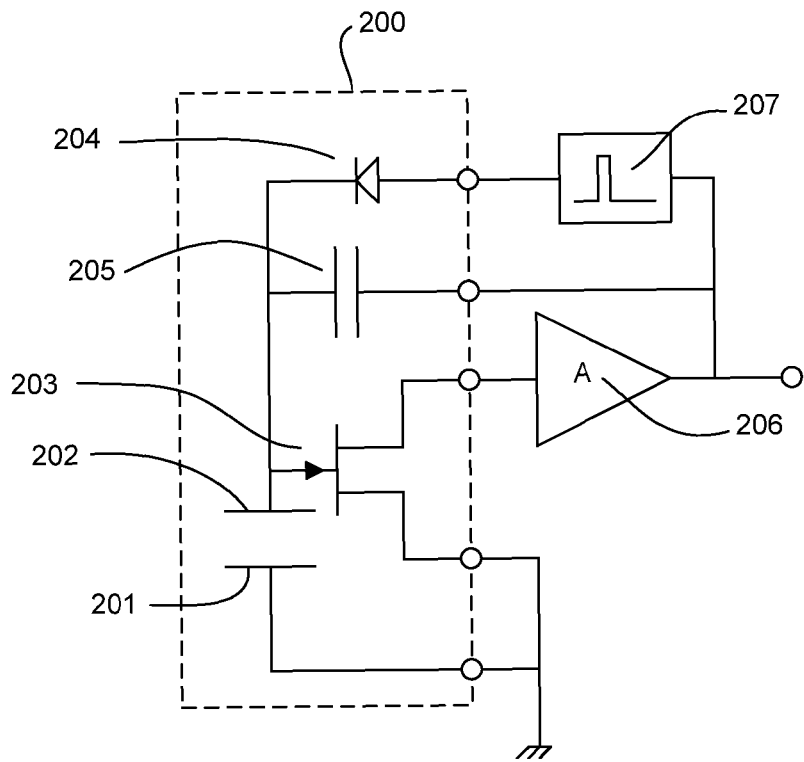
Figure 2B:
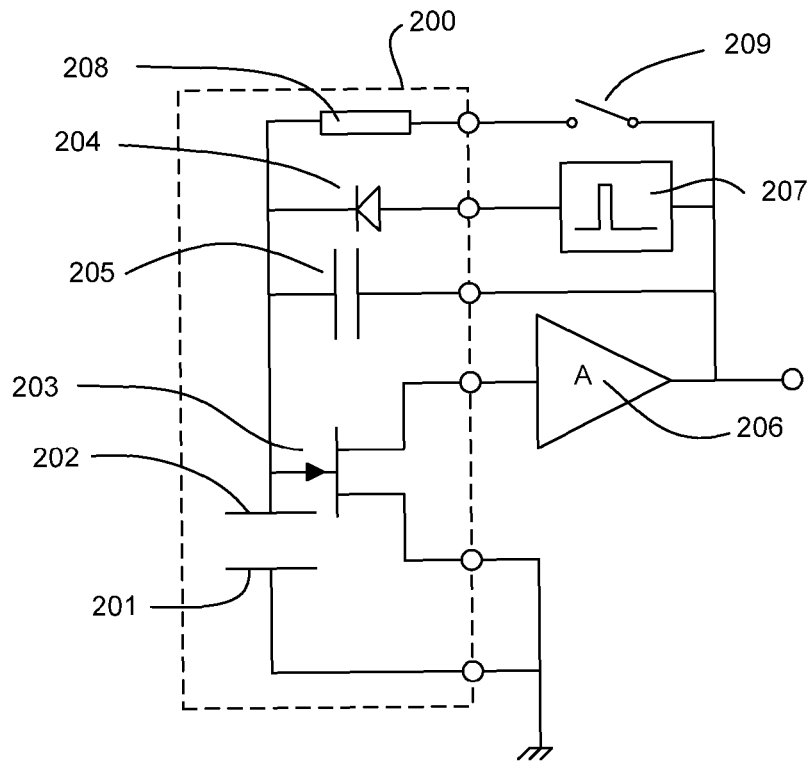

The invention is now elucidated using figures, in which identical reference numerals refer to identical features. Hereto:

FIG. 1A schematically shows a SDD,

FIG. 1B schematically shows the central part of the SSD shown in FIG. 1A,

FIG. 2A schematically shows an electronic representation of a (part of a) prior art detector, and FIG. 2B schematically shows an electronic representation of a (part of a) detector according to the invention.

FIG. 1A schematically shows a SDD.

A SDD is formed from by a silicon wafer 10, showing a volume of high purity, or at least showing little recombination sides, between a first side 11 and a second side 18. Side 11 comprises the anode 16 and side 18 comprises the cathode 19. Electrodes of any electron/hole pairs generated in the volume between these two sides will drift to the anode and the holes to the cathode(s). Side 11 shows at a first side 11 a central electrode 12 forming the drain of a FET. An electrode 13 surrounding the central electrode forms the gate of the FET, and electrode 14 surrounding electrode 13 forms the source of the FET. The FET is shielded from the rest of the silicon wafer by a shield electrode 15 surrounding electrodes 12, 13 and 14, both laterally and 'inside' the wafer. The anode is connected to the gate of the FET (connection not shown in FIG. 1A).

Surrounding the anode a number of concentric electrodes 17-i are formed. The innermost of these concentric electrodes is connected to a voltage close to the anode voltage, the successive rings 17-i connected to voltages increasing from slightly above the anode voltage for the innermost of these electrodes to a voltage close to or equal to the cathode voltage for the outermost electrode.

The ring electrodes 17-i cause a field inside the wafer that guides all electrons from electron/hole pairs to the anode, while the anode is only a small structure and thus shows only a small capacitance with respect to the cathode.

It is noted that, in working, a voltage difference is applied to the anode/cathode. Hereby the capacitance of the anode with respect to the cathode is reduced. SDDs with an anode capacitance of 0.15 pF in working are commercially available.

FIG. 1B schematically shows a detail of the SDD shown in FIG. 1A. FIG. 1B shows the part from the centre until the anode. Here the connection between anode 16 and the gate of the FET is schematically shown as a metallization 21 Side 18 is the side sensitive to radiation. Underneath this surface the sensitive volume 20 is shown. X-rays incident on the sensitive surface penetrate into the volume and generate in this volume a number of electron/hole pairs. The amount of electron/hole pairs depends on the energy of the photon. In normal operation the number of photons is such, that each event can be detected separately, and thus the number of electron/hole pairs per event, that is: per incident photon.

Charge accumulates on the anode forcing the voltage of the anode to become more and more negative (with respect to the cathode) until a reset of the anode is caused by resetting the anode with, for example, a reset diode (not shown). Alternatively leakage current from the drain of the FET to its gate can be used to compensate for the average charge accumulation.

It is noted that often a feedback capacitor is integrated on the SDD, connecting the anode to an output, but that this capacitor can also be placed outside the SDD.

FIG. 2A schematically shows an electronic representation of a (part of a) prior art detector.

The electronic representation shows the SDD used in a charge amplifier configuration. The part within box 200 are part of the SDD, the other parts are external to the SDD. The SDD comprises a cathode 201 and an anode 202, a FET 203 of which the gate is internally connected to the anode 202, a feedback capacitor 205 of which one side is connected to the anode 202, and a reset element in the form of diode 204 of which the cathode is connected to the anode 202. Connected to outputs of the SDD are its cathode, the source and drain of the FET, the side of the feedback capacitor not connected to the anode 202, and the anode of the reset diode. The external connections of the cathode 201 and the source of the FET are tied together to ground potential. The drain of the FET is connected to an amplifier 206. The output of the amplifier is connected to the feedback capacitor on the SDD and thus a charge amplifier is formed. Further reset logic 207 is connected to the output of the amplifier, which produces a pulse to the anode of the reset diode, as a result of which the SDD is reset.

It is mentioned that, when the FET is used as a source follower, and where the voltage between drain and gate $V_{dg}$ varies, the detector can operate in so-called "continuous reset mode", in which the reset logic is not active, or not even present, and the drain/gate voltage of the FET generates a (voltage dependent) leakage current that compensates the induced (average) anode/cathode current.

Not shown, but necessary for operating the detector, are electronics for biasing the anode 202, the drain of the FET, and the concentric rings 107-*i*. It is noted that the voltages for the concentric rings can be derived from a resistive network integrated on the SDD between its anode and its cathode.

It is noted that the output of the amplifier is connected to further electronics and logic to determine the pulse height of the charge amplifier resulting from an incident photon.

In Application note AN-SDD-003:Amptek Silicon Drift Detectors (http://www.amptek.com/pdf/ansdd3.pdf), more specifically in FIG. 10 and associated text, the noise of this circuit is discussed.

FIG. 2B schematically shows an electronic representation of a (part of a) detector according to the invention.

The detector according to the invention resembles the prior art detector shown in FIG. 2A. By adding a feedback element in the form of feedback resistor 208 that can be selectively connected in a feedback loop by switch 209, the detector can be switch from its normal pulse height measurement mode (PHMM), in which switch 209 is opened and the feedback element is not active, to a current measurement mode (CMM), in which switch 209 is closed and the feedback element is part of the feedback loop. In this mode the reset logic 207 should be disabled.

It is noted that the switch 209 can be a mechanical relay, such as a reed relay, or an electronic switch, such as a FET.

The feedback via capacitor 205 need not be disabled, as this does not influence the feedback via the resistor 208. However, the switch may also select feedback between the capacitor 206 and the resistor when executed as a double pole switch.

It is further noted that the feedback element can also show a voltage/current characteristic that is non-linear (non-ohmic), in other words that it can be different from a resistor. A logarithmic response can be realized by using, for example, a diode as feedback element. As such a diode is often already present in the form of the reset diode, the detector can then use a prior art SDD. The resultant detector has a large dynamic range in CMM.

In this mode, using a diode as feedback element, is not identical to a prior art detector where reset logic 207 produces a signal that is continuously high. The reset logic produces a pulse with a specified voltage to reset the anode. In CMM the voltage on the diode is dependent on the current induced between anode 202 and cathode 201: the current through the diode equals the current between anode and cathode.

It is noted that U.S. Pat. No. 7,858,946 describes a detector comprising a SDD where the input of the first amplifier is connected to the source of the FET. Although this patent describes this as the typical usage, other documents, such as http://home.dei.polimi.it/sampietr/Ratex/RATEX1.html state that "The disadvantage of the Source Follower configuration is represented by the instability of the charge-to-voltage conversion made by the overall capacitance seen by the anode" and advocate the use of the detector in charge sensitive amplifier configuration. However, the invention is also relevant to detectors comprising a SDD in source follower mode. It is noted that the polarity of the amplification of the amplifier is different for the two modes (source follower, with the source connected to amplifier or drain connected to amplifier).

It is noted that in these examples and embodiments a circle symmetric SDD is shown, but that also asymmetric SDD's, for example shaped like a teardrop, are known, where the anode/FET are placed far from the center, as well as multiple SDD's integrated on one part of silicon. For use in a charged particle apparatus such as a SEM, a STEM or a FIB, a SDD showing a central through-hole or multiple SDD's arranged around a central through-hole may be contemplated, the central through-hole for passing the beam of charged particles that irradiates the sample.

Examples of a teardrop shaped SDD as well as a quadruple SDD with a central hole are known from, for example, http://www.pnsensor.de/Welcome/Detector/SDD/index.html. An advantage of a larger number of SDD's on one chip, each connected with its own electronics, is that the maximum count rate improves as there are several SDD's in detecting parallel.

We claim as follows:

1. A radiation detector for detecting X-rays and electrons incident on a surface, the detector comprising a Silicon Drift Diode,
   a voltage/current converter between an I/O port and the anode, a switch configured to selectively connect the voltage/current converter, as a result of which the Silicon Drift Diode is equipped to switchably operate in a pulse height measurement mode or a current measurement mode,
   a surface sensitive to radiation disposed opposite to a surface on which the anode is formed,
   an active volume close to the surface sensitive to radiation, a distance of the active volume to the surface sensitive to radiation sufficiently small for electrons with an energy as low as 20 keV to penetrate to the active volume and generate electron/hole pairs in the active volume, as a result of which the detector can selectively be used as a detector for detecting X-rays incident on the surface in the pulse height measurement mode or as a detector for detecting electrons incident on the surface in the current measurement mode.

2. The radiation detector of claim 1 in which the voltage/current converter is a resistor, as a result of which the current measurement mode is a linear current measurement mode.

3. The radiation detector of claim 1 in which the voltage/current converter is a diode, as a result of which the current measurement mode is a logarithmic current measurement mode.

4. A charged particle apparatus equipped with a detector according to claim 1, the apparatus equipped to scan a sample with a finely focused charged particle beam, as a result of which secondary radiation including X-rays, backscattered electrons and secondary electrons emerge from the sample, the apparatus equipped with means for selectively blocking the backscattered electrons and the secondary electrons emerging from the sample to reach the detector or for passing the backscattered electrons and/or the secondary electrons, the means passing X-rays emerging from the sample.

5. The charged particle apparatus of claim 4 in which the means for selectively blocking the backscattered electrons and the secondary electrons emerging from the sample to reach the detector or for passing the backscattered electrons and/or the secondary electrons takes a form of a switchable magnetic or electrostatic deflection field.

6. The charged particle apparatus of claim 4 in which the means for selectively blocking the backscattered electrons and the secondary electrons emerging from the sample to reach the detector or for passing the backscattered electrons and the secondary electrons takes a form of a switchable electrostatic decelerating field, reflecting the electrons when blocking the electrons.

7. The charged particle apparatus of claim 4 in which the means for selectively blocking the backscattered electrons and the secondary electrons emerging from the sample to reach the detector or for passing the backscattered electrons and the secondary electrons takes a form of a foil that is inserted between the detector and the sample when stopping the electrons and removed between the sample and the detector when passing the electrons.

8. A Silicon Drift Diode for detecting X-rays and electrons, comprising:

an anode and an output, the Silicon Drift Diode producing a pulse on the output in response to a single detected photon, the output connected to electronic circuitry for measuring an output signal;

a voltage/current converter between an I/O port and the anode;

a feedback loop controlled by a switch, as a result of which the Silicon Drift Diode is equipped to switchably operate in a pulse height measurement mode for detecting x-rays or a current measurement mode for detecting electrons;

an outer surface sensitive to radiation; and an active volume configured to generate electron-hole pairs when impinged upon by a radiation, wherein a distance from the active volume to the outer surface is small enough that electrons with energies of 20 keV irradiating the outer surface can penetrate to the active volume and generate electron/hole pairs in the active volume, and wherein the Silicon Drift Diode is configured to detect electrons penetrating the active volume during operation of the Silicon Drift Diode in the current measurement mode.

9. The Silicon Drift Diode of claim 8, wherein the Silicon Drift Diode is configured to detect energies of the x-rays during operation of the Silicon Drift Diode in the pulse height measurement mode.

10. The radiation detector of claim 8, wherein the electrons comprise backscattered electrons and secondary electrons.

11. The radiation detector of claim 8 in which the distance from the active volume to the outer surface is small enough that electrons with energies of 2 keV irradiating the outer surface can penetrate to the active volume and generate electron/hole pairs in the active volume.

12. The radiation detector of claim 11 in which the distance from the active volume to the outer surface is small enough that electrons with energies of 500 eV irradiating the outer surface can penetrate to the active volume and generate electron/hole pairs in the active volume.

13. The radiation detector of claim 1 in which the distance of the active volume to the surface sensitive to radiation is sufficiently small for electrons with an energy of 2 keV to penetrate the active volume and generate electron/hole pairs in the active volume.

14. The radiation detector of claim 13 in which the distance of the active volume to the surface sensitive to radiation is sufficiently small for electrons with an energy of 500 eV to penetrate the active volume and generate electron/hole pairs in the active volume.

* * * * *